(12) United States Patent
DeJean et al.

(10) Patent No.: US 9,804,260 B2
(45) Date of Patent: Oct. 31, 2017

(54) RF PROXIMITY SENSOR

(71) Applicant: Microsoft Technology Licensing, LLC, Redmond, WA (US)

(72) Inventors: Gerald DeJean, Redmond, WA (US); Trang Thai, Atlanta, GA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 605 days.

(21) Appl. No.: 14/261,300

(22) Filed: Apr. 24, 2014

(65) Prior Publication Data

US 2014/0240164 A1    Aug. 28, 2014

Related U.S. Application Data

(63) Continuation of application No. 13/214,025, filed on Aug. 19, 2011, now Pat. No. 8,766,657.

(60) Provisional application No. 61/498,417, filed on Jun. 17, 2011.

(51) Int. Cl.
| | |
|---|---|
| *G01R 31/312* | (2006.01) |
| *G01S 11/02* | (2010.01) |
| *H03K 17/955* | (2006.01) |
| *G01S 13/06* | (2006.01) |

(52) U.S. Cl.
CPC ............... *G01S 11/02* (2013.01); *G01S 13/06* (2013.01); *H03K 17/955* (2013.01); *H03K 2217/960755* (2013.01)

(58) Field of Classification Search
CPC ........ G01D 5/24; G01D 5/241; G01D 5/2415; G01D 5/2412; G01D 5/2417; G01L 1/14; G01L 1/142; G01R 31/312; G01R 31/08; G01R 31/2805; G01R 31/2812; G01R 31/2887; G01R 31/2831; G01R 27/2605; G01R 31/2886; G01R 31/2891; G01R 1/07314; G01R 1/06794; G06F 3/0488; G06F 3/04883; G06F 3/044; G06F 3/045; G06F 3/0412; G06F 3/0416; G06F 3/046; G06K 9/0002; G01N 27/226
USPC ......... 324/750.16–750.17, 754.28, 519, 658, 324/661, 686, 662, 681, 207.11; 345/173, 345/174
See application file for complete search history.

(56) References Cited

U.S. PATENT DOCUMENTS

| | | | | |
|---|---|---|---|---|
| 7,064,631 B2* | 6/2006 | Shih | ..................... | H01P 1/20345 333/204 |
| 8,760,242 B2* | 6/2014 | Tamaru | ..................... | H03H 7/09 333/176 |
| 2007/0241839 A1* | 10/2007 | Taniguchi | ................ | H03H 7/09 333/185 |

(Continued)

*Primary Examiner* — Thang Le (57) ABSTRACT

A sensor has a strip resonator filter that energizes an emitter patch which emits an electric field out from the strip resonator filter (away from the strip resonator filter). The capacitance of the filter, or specifically the coupling capacitance and radiation pattern of the slotted patch, is altered when an object such as a finger is near the sensor. Resulting changes in a signal outputted by the filter can be used to determine how close the object is to the sensor. The strip resonator filter may be a half wavelength strip resonator coupled filter having three separate strips. The patch may have a slot and two accompanying strips. An arrangement of multiple sensors may detect the position of an object in two or three dimensions.

17 Claims, 8 Drawing Sheets

(56) References Cited

U.S. PATENT DOCUMENTS

| | | | | |
|---|---|---|---|---|
| 2011/0022351 A1* | 1/2011 | Philipp | ............... | G06F 3/044 702/150 |
| 2011/0175671 A1* | 7/2011 | Reynolds | ............ | G06F 3/044 327/517 |
| 2011/0310059 A1* | 12/2011 | Miyamoto | ......... | G06F 3/0412 345/174 |
| 2012/0146943 A1* | 6/2012 | Fairley | ............... | G02F 1/167 345/174 |

* cited by examiner

RF PROXIMITY SENSOR

CROSS-REFERENCE TO RELATED APPLICATION

This application is a Continuation of application Ser. No. 13/214,025, filed Aug. 19, 2011, which claims the benefit of provisional Application No. 61/498,417, filed Jun. 17, 2011, and incorporated in original form herein by reference.

BACKGROUND

Proximity sensors have been used to sense the proximity of fingers, styluses, hands, and other objects. Proximity sensors can be used as non-touch input interfaces. Non-touch input interfaces can be helpful with numerous software applications such as free-finger key entry, free-finger gesturing or handwriting, navigation, and manual manipulation of software objects, to name a few. Proximity sensors can have practical advantages; they can enable efficient interaction on small devices that have small input areas, they can avoid the mechanical wear and tear of contact type input devices, they are unobtrusive, and they can be used for both touch and non-touch input.

A variety of types of proximity sensors have been used. Acoustic sensors, while feasible, can be affected by echoes, air currents, and humidity. Optical sensors operate by line-of-sight, require significant power, can be affected by surface texture, have a slow update rate, and involve expensive post-processing to make sensing decisions. Capacitive proximity sensors, also known as electric field sensors, are also available, but they have had low range and sensitivity, and their size has been dependent on the size of sensor electrodes.

Devices and techniques discussed below relate to capacitive based proximity sensing that may result in improved range and sensitivity in the presence of a finger or other conductive object, while possibly allowing miniaturization and low power consumption.

SUMMARY

The following summary is included only to introduce some concepts discussed in the Detailed Description below. This summary is not comprehensive and is not intended to delineate the scope of the claimed subject matter, which is set forth by the claims presented at the end.

A sensor has a strip resonator filter that energizes an emitter patch which emits an electric field out from the strip resonator filter (away from the strip resonator filter). The capacitance of the filter, or specifically the coupling capacitance and radiation pattern of the slotted patch, is altered when an object such as a finger is near the sensor. Resulting changes in a signal outputted by the filter can be used to determine how close the object is to the sensor. The strip resonator filter may be a half wavelength strip resonator coupled filter having three separate strips. The patch may have a slot and two accompanying strips. An arrangement of multiple sensors may detect the position of an object in two or three dimensions.

BRIEF DESCRIPTION OF THE DRAWINGS

The present description will be better understood from the following detailed description read in light of the accompanying drawings, wherein like reference numerals are used to designate like parts in the accompanying description.

Many of the attendant features will be explained below with reference to the following detailed description considered in connection with the accompanying drawings.

DETAILED DESCRIPTION

Figure 1:
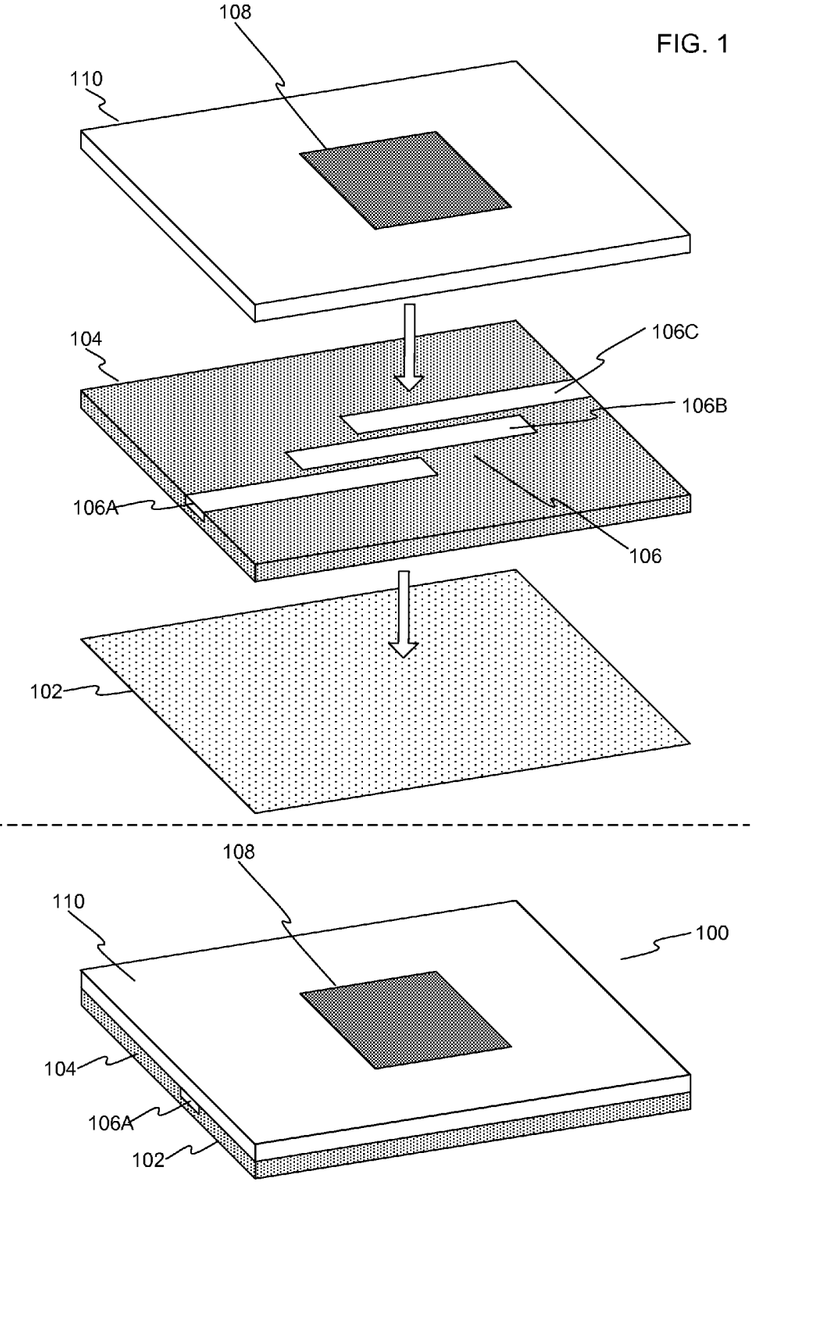
FIG. 1 shows a capacitive proximity sensor.

FIG. 1 shows a capacitive proximity sensor 100. The upper part of FIG. 1 (above the dashed line) shows elements of the capacitive proximity sensor 100 broken out for illustration. The lower part of FIG. 1 shows the capacitive proximity sensor 100 in constructed form.

In the embodiment shown in FIG. 1, a ground plane 102 of some conductive material such as copper serves as a ground for the capacitive proximity sensor 100. In an embodiment with multiple sensors (see FIGS. 7 and 8), each sensor may have its own ground plane 102, or a common ground plane 102 may be used for all of the sensors. The ground plane 102 may also be part of a larger ground plane of a circuit board on which the capacitive proximity sensor 100 resides, such ground plane serving as ground for other circuitry.

The ground plane 102 is operatively layered with a first substrate 104, which may be a material such as FR-4 or the like. The first substrate layer may have a thickness in the range of 0.004"-0.060", but thickness may vary according to material, overall size of the sensor, dielectric coefficient, and other factors. Functionally, substrate 104 separates the ground plane 102 from a half wavelength strip resonator coupled filter 106 (also to be referred to as a "strip filter", for short). That is, the first substrate, which may even be air, for example, enables the propagation of the signals on the microstrip lines.

The half wavelength strip resonator coupled filter 106 includes three individual and separate conductive strips; first outer conductive strip 106A, inner conductive strip 106B, and second outer conductive strip 106C. Other types of filters may be used, provided that sufficient energy (electric field) is directed to the opposite side of patch 108 (i.e., "above" the patch 108). The conductive strips 106A, 1068, 106C are arranged between first substrate 104 and a second substrate 110, and may be on a surface of substrate 110 and embedded in substrate 104, on a surface of substrate 104 and embedded in substrate 110, or otherwise arranged between the first substrate 104 and the second substrate 110. Note that various functionally neutral materials (adhesives, laminates, other substrates, micro wires, etc.) may reside between components of the capacitive proximity sensor 100, for example between substrates, or other components; there is no requirement that there be physical contact between first substrate 104 and second substrate 110, between first substrate 104 and/or second substrate 110 and half wavelength strip resonator coupled filter 106, between patch 108 and second substrate 110, etc.

The patch 108 is separated from the half wavelength strip resonator coupled filter 106 by the second substrate 110. The patch 108 may take various forms, as will be described later. However, in the embodiment shown in FIG. 1 the patch 108 is a simple rectangular patch of conductive material. The patch 108 is capacitively charged by the half wavelength strip resonator coupled filter 106. When an object such as a finger is near the patch 108, the electric field emitted by the patch 108 is altered, changing the reflective (capacitive) properties of the patch 108, resulting in detectable changes in frequency and/or voltage at either or both outer conductive strips 106A, 106C.

Figure 2:
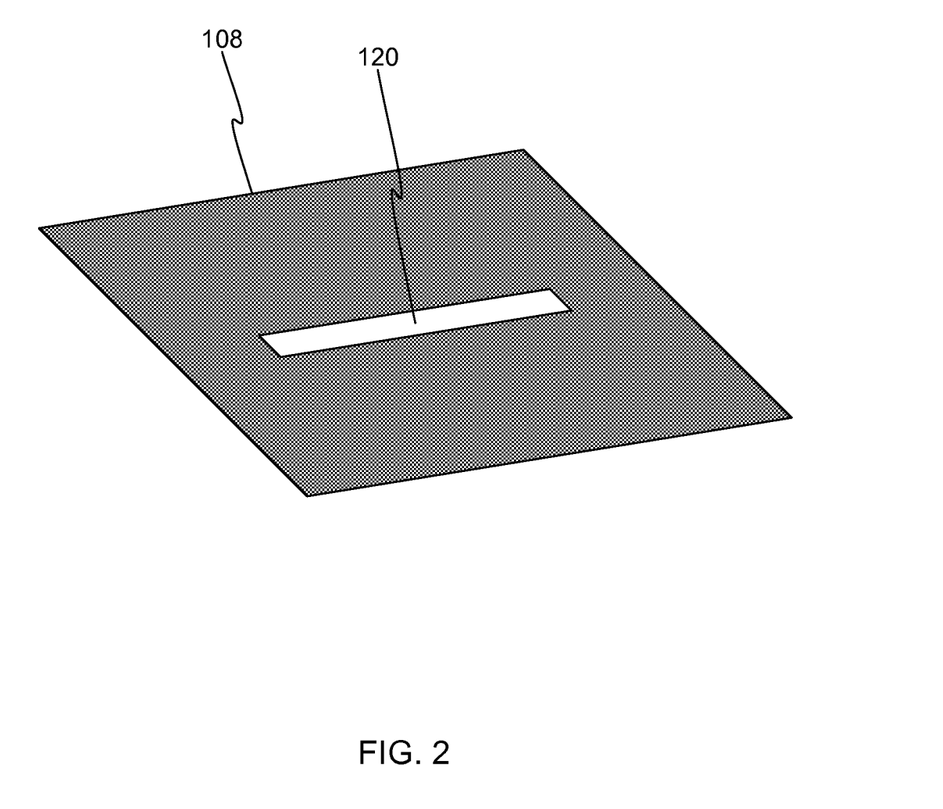
FIG. 2 shows an embodiment where a patch has a slot opening.

As mentioned, the patch 108 may take various forms. In one embodiment, patch 108 is a square with a 380 mil (9.65 mm) length side. FIG. 2 shows an embodiment where the patch 108 has a slot opening 120. Slot opening 120 may improve the responsiveness of the capacitive proximity sensor 100. The length-wise direction of slot opening 120 may be perpendicular to the length-wise direction of the strips of the half wavelength strip resonator coupled filter 106. In this embodiment, the patch 108 may have a side of length 500 mil (12.70 mm), and the slot opening 120 may be a 250 mil (6.35 mm) by 10 mil (0.25 mm) rectangle.

Figure 3:
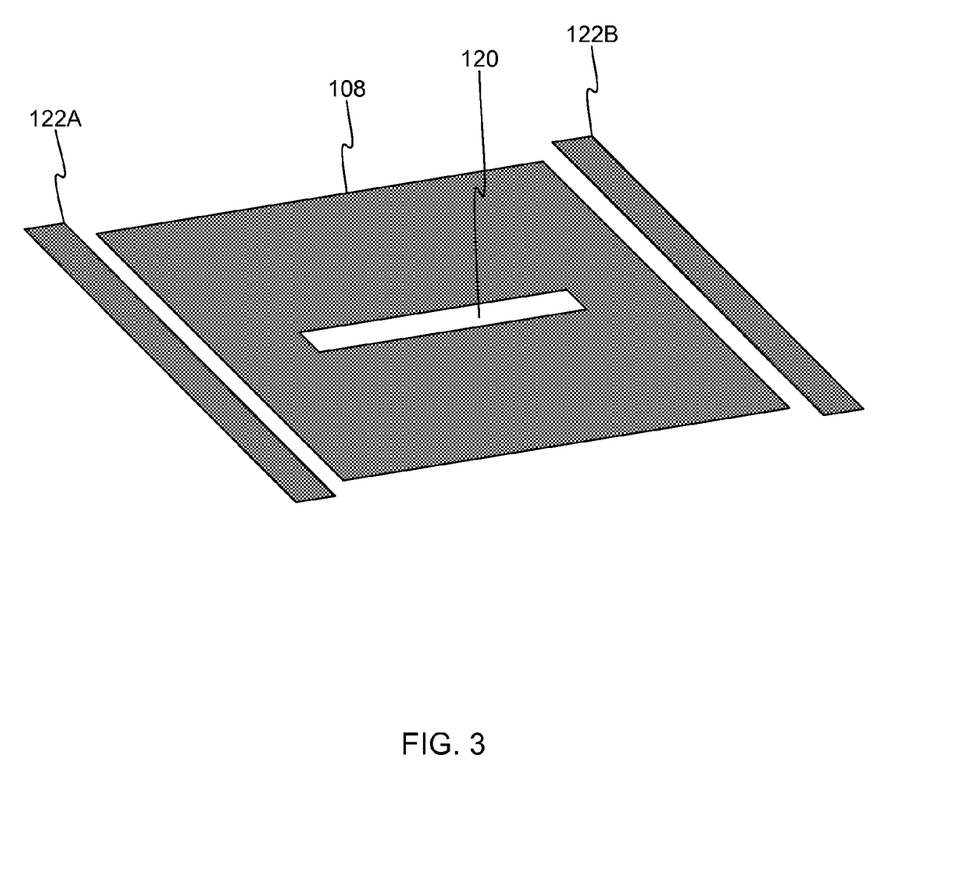
FIG. 3 shows another patch configuration.

FIG. 3 shows another patch configuration. In addition to patch 108 and slot opening 120, two parasitic strips 122A, 122B are near edges of patch 108. The parasitic strips 122A, 122B may also improve the efficiency and responsiveness of the capacitive proximity sensor 100. In one embodiment, the parasitic strips 122A, 122B are used without the slot opening 120. With this embodiment, the patch 108 may have a side of length 500 mil (12.70 mm). The slot opening 120 may have a length of 600 mil (15.24 mm) and a width of 56 mil (1.42 mm). There may be a coupling gap of 10 mil (0.25 mm) between parasitic strips 122A, 122B and the patch 108. A finger or other object acts as a conductive object that modifies the coupling effect between the parasitic strips 122A, 122B and the patch 108, and between the patch 108 and the half wavelength strip resonator coupled filter 106 below it. Also, the finger affects the radiation field of the patch 108 and the parasitic strips 122A, 122B positioned close to the sides of the slotted patch 108. Both factors contribute to shift the resonant frequency of the half wavelength strip resonator coupled filter 106.

Figure 4:
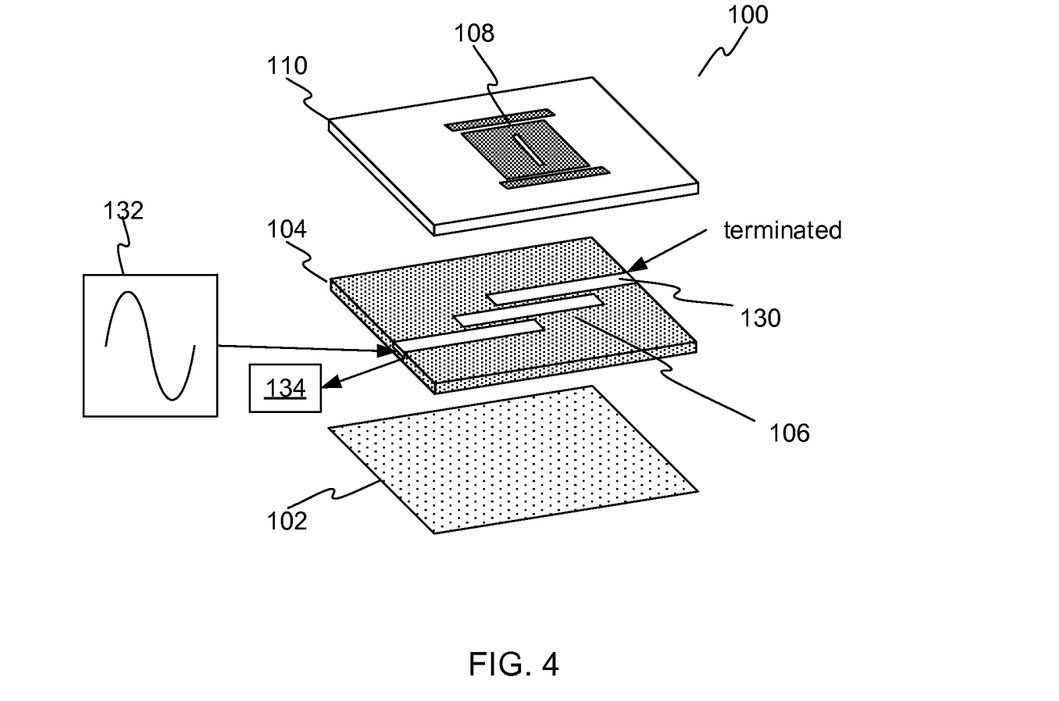
FIG. 4 shows a capacitive proximity sensor with a terminated strip that measures reflected signal.

FIG. 4 shows capacitive proximity sensor 100 with a terminated strip 130. In this embodiment the strip filter is powered by a power source 132, which may supply a signal of anywhere from 6.5 GHz to 6.7 GHz. The powered filter in turn energizes the patch 108 (as well as parasitic strips and/or a slot opening, in varying embodiments). A reflection measurement circuit 134 measures the reflected signal from the strip filter. Energy and or frequency may be measured. In one embodiment, voltage may be measured at different frequencies. The energy and frequency of the reflected signal will depend on both the supply frequency and power, nearness of any object to the sensor, and numerous factors.

Generally, in terms of frequency of the reflected signal, when there is no object near the sensor, a reflected reference signal with frequency of 6.6 GHz is detected (at approximately −6 dB). When an object is within 20 mm, a minor frequency shift may occur (i.e., a difference in frequency between the supply signal and the reflected signal), but the reflected signal may strengthen by 0.5 dB. When an object is within 10 mm, relative to the reference signal, the reflected signal is approximately 25 MHz greater (there is a 25 MHz shift), with a power of approximately −7.2 dB. When the object is within 5 mm of the sensor, the reflected signal may be 100 MHz greater than the reference signal, with relative reflected power around −6 dB. At 2 mm, a similar frequency shift occurs; with power around −5 dB. Thus, it can be seen that with a terminated filter strip, proximity can be determined from frequency shifts and/or changes in power; different sensed values indicate corresponding different distances of an object.

Figure 5:
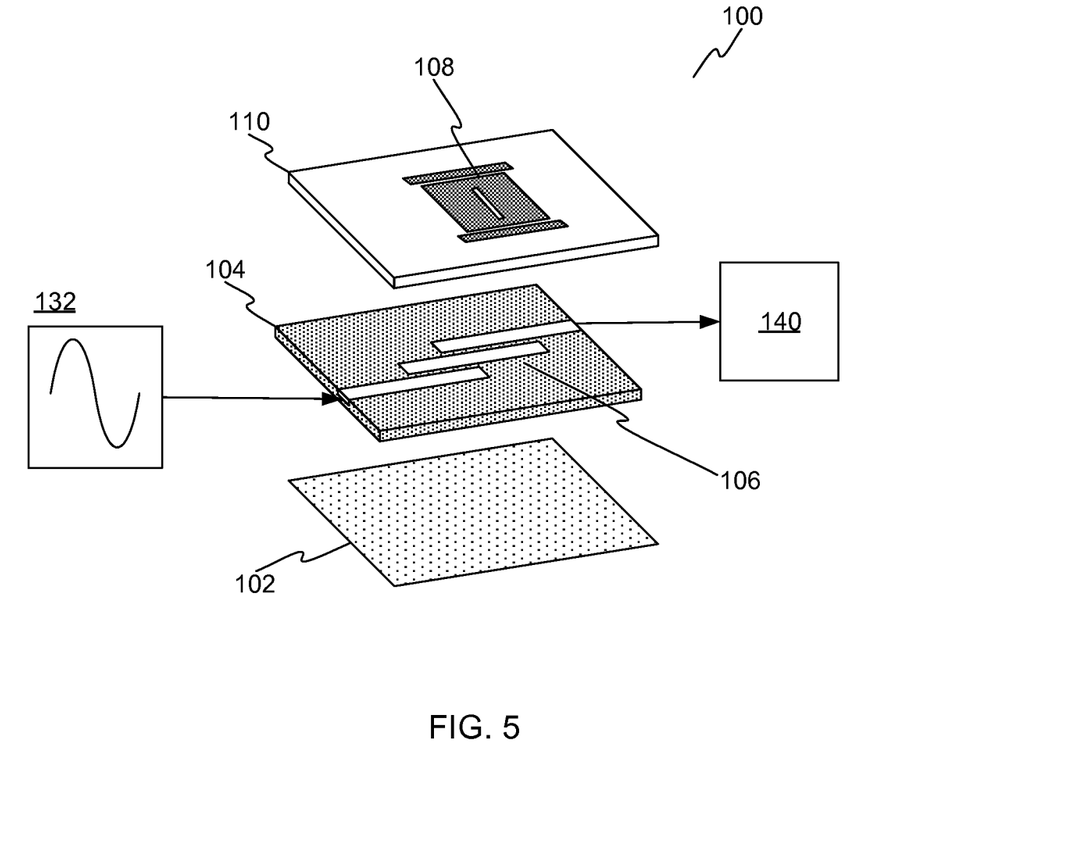
FIG. 5 shows a sensor embodiment that measures a signal transmitted through a half wavelength strip resonator coupled filter, which is not terminated.

FIG. 5 shows a sensor embodiment that measures a signal transmitted through the half wavelength strip resonator coupled filter 106, which is not terminated. With this embodiment, a transmission measurement circuit 140 measures frequency and/or power transmitted through the half wavelength strip resonator coupled filter 106. Voltage rather than current may be a convenient measure of power, due to lower power requirement and lower noise. Operating at a range of around 6.3 to 6.7 GHz, a ratio of voltage of the signal supplied by the power source 132 (to in input terminal or port) can be evaluated. By monitoring the voltage level at different frequencies, displacement of a finger above the sensor can be estimated. As noted, sensing voltage level at distinct frequencies consumes significantly less power than sensing current level, and is also less susceptible to noise.

At around 6.6 GHz, a reference measurement when no finger is present may indicate around −6.5 dB voltage lost by absorption. A finger about 20 mm distant may result in about 1.5 dB increase in lost voltage (relative to the reference signal). A finger about 10 mm distant may result in a 2 dB decrease in lost voltage.

Figure 6:
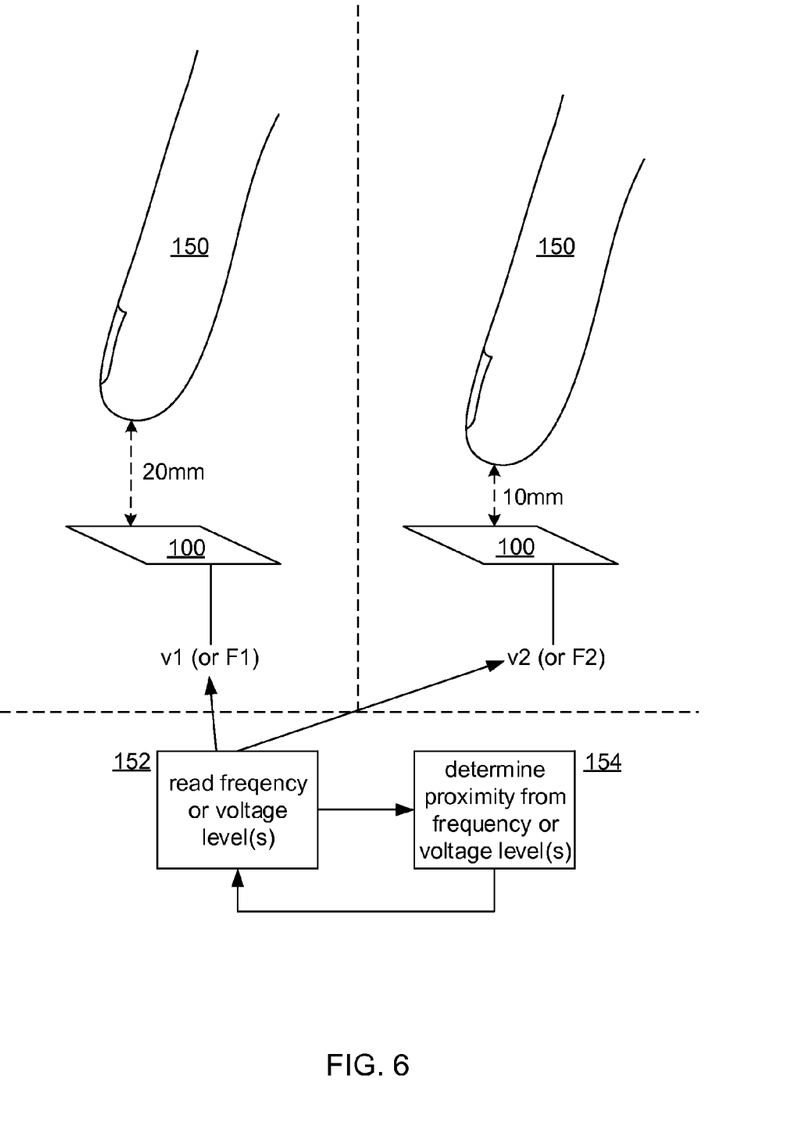
FIG. 6 shows how proximity of an object such as a finger can be determined from readings of various embodiments of the capacitive proximity sensor.

FIG. 6 shows how proximity of an object such as a finger 150 can be determined from readings of various embodiments of the capacitive proximity sensor 100. At a step 152, a pass-through or reflected signal is measured as the presence of the finger 150 shifts the resonant frequency of the filter structure, as described above. At step 154, based on the measured signal of one sensor, a one-dimensional estimate of object proximity can be computed. In other words, a z-axis measure is ultimately outputted.

To determine proximity, two parameters, peak frequency and magnitude of the signal (voltage), of the frequency response of the transducer can be tracked. Consider a VCO (voltage controlled oscillator) generating signals between 6-7 GHz through the sensor. The output signals can be amplified with constant gain, and peak frequency is detected and tracked with a phase lock loop circuit (or equivalent circuit). If the peak frequency is shifted, the shift indicates the new relative proximity from the previously known estimation. If the peak frequency is constant, but the magnitude changed, then the new relative proximity can also be estimated. For example, if from 2 mm to 5 mm the peak frequency is shifted lower and the magnitude is increased, the same response applies to the response for 5 mm to 10 mm. From 10 to 20 mm or further, the peak frequency is negligibly shifted lower, which can be considered as constant (depending on the complexity of the processing circuits) but the magnitude is decreased in a consistent and distinguishable manner.

Figure 7:
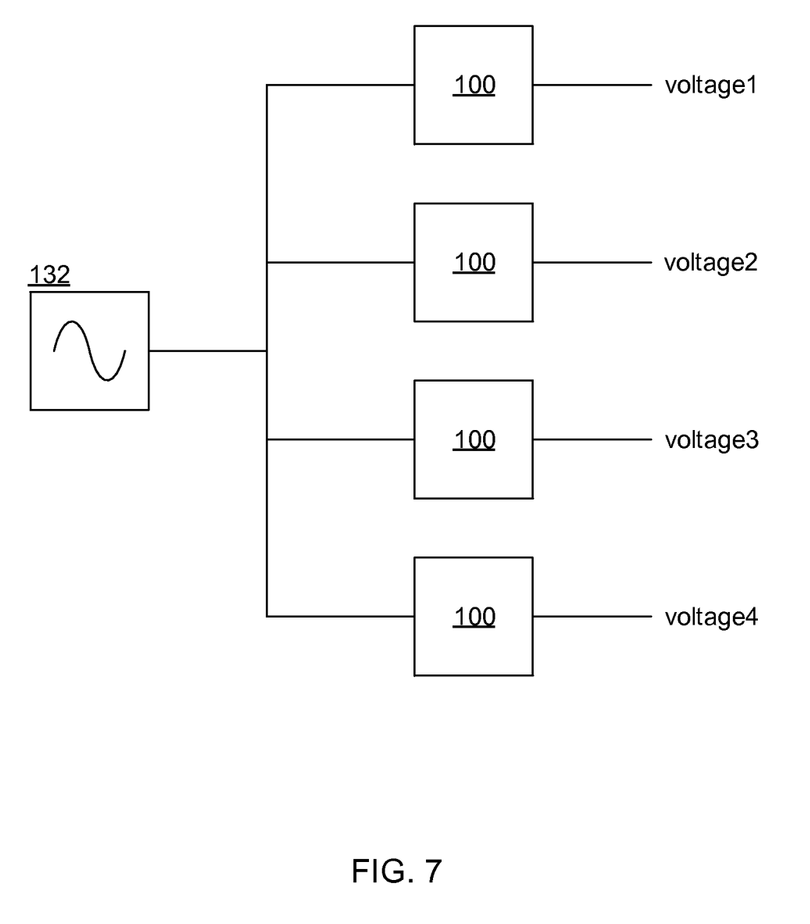
FIG. 7 shows a multi-sensor embodiment.

FIG. 7 shows a multi-sensor embodiment. This type of arrangement can be used to produce positional estimates of two or three dimensions. A plurality of capacitive proximity sensors 100 is provided. The sensors may share common substrates, ground planes, etc. or may have individual separate components. Power source 132 can supply power to each capacitive proximity sensor 100, as discussed above. A proximity measure may be produced for each sensor, for example, voltage1 through voltage4 for respective sensors. The proximity measures of each sensor can be interpolated as a whole to estimate a location of a nearby object in three dimensions. While FIG. 7 shows a pass-through measurement, the sensors can be terminated and reflected signals can be measured, as explained above.

Figure 8:
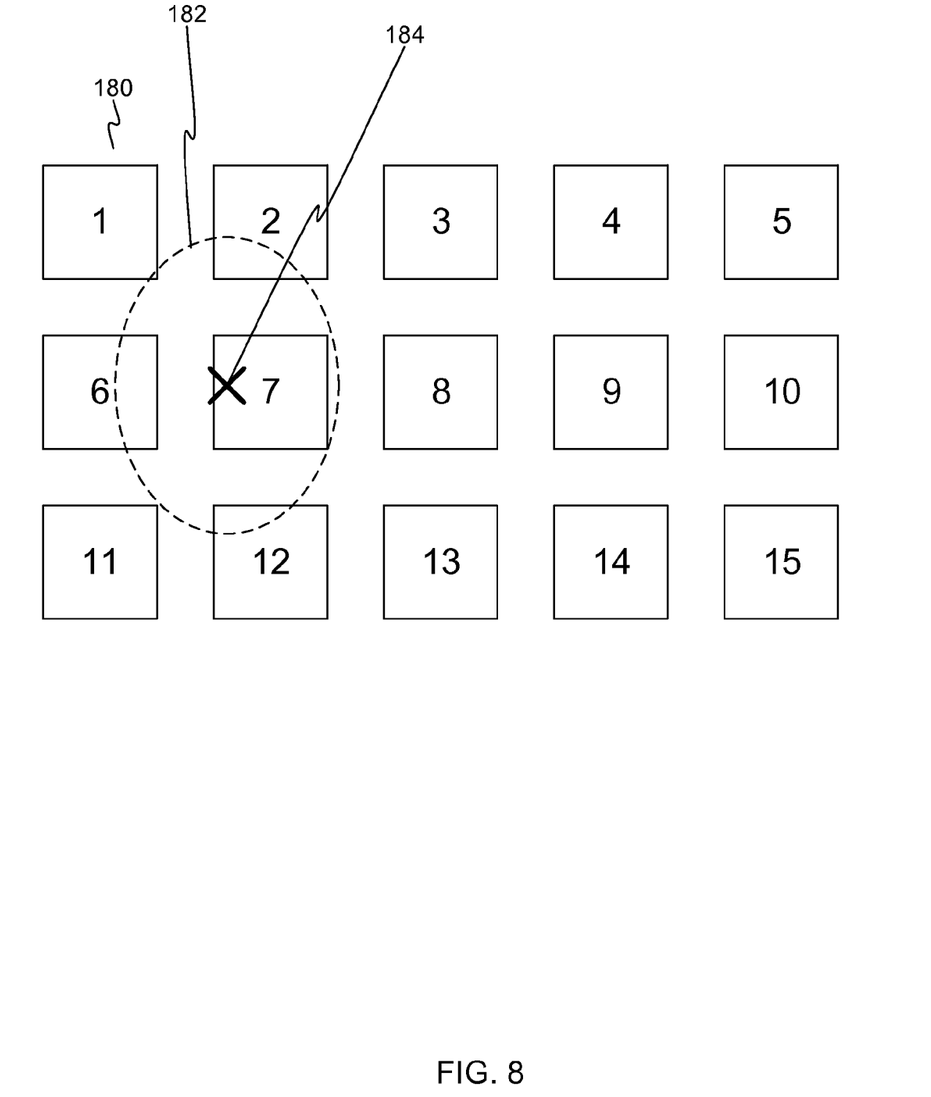
FIG. 8 shows another multi-sensor embodiment.

FIG. 8 shows another multi-sensor embodiment. Sensors are arranged in a mesh or array 180 (i.e., in a regular pattern such as in a rectilinear grid, etc.). Oval 182 represents a nearby finger tip above the array of sensors 180. Signals of the sensors are monitored and when a finger or the like is nearby as indicated by oval 182, estimated scalar readings for sensors, as denoted (sensor, reading) are: (1, 0.1), (2, 0.3), (6, 0.4), (7, 1.0), (11, 0.05), (12, 0.2). A two-dimensional position 184 (e.g., a point on the array of sensors 180) is computed form the relative strengths of the respective sensor scalar values and their known locations. A height or z-dimension of the finger is computed from the magnitudes of the scalar values. Multiple proximate objects can be detected at the same time.

As mentioned in the Background, there are many applications for the single sensor and also for an array of sensors. Touchless buttons and keys, non-touch free-finger interfaces, three-dimensional non-touch input, input surfaces that respond to both touch and proximity, and so on.

It will be appreciated that variations in dimension, material, and minor variations in form and layout of embodiments described herein are possible while still providing practical and efficient capacitive-type proximity detection.

The invention claimed is:

1. A method comprising:
obtaining measures of a signal feature from a proximity sensor at times, respectively, while an object is sufficiently close to the proximity sensor to affect the measures of the signal feature, wherein the proximity sensor comprises, in order of stack arrangement: a conductively isolated patch filter, a first substrate, a strip filter, and a ground plane, wherein a driving signal drives the strip filter and the signal feature measures are obtained from the strip filter; and
determining distances of the object from the proximity sensor corresponding to the times, respectively, according to the respective measures of the signal feature.

2. A method according to claim 1, wherein the obtaining measures comprises receiving the measures from a reflection measurement circuit that measures a signal reflected by the strip filter, wherein the signal feature is a feature of the reflected signal.

3. A method according to claim 1, wherein the signal feature comprises frequency or voltage.

4. A method according to claim 1, wherein the obtaining measures comprises receiving the measures from a transmission measurement circuit that measures a signal transmitted through the strip filter, wherein the signal feature is a feature of the reflected signal.

5. A method according to claim 4, wherein the signal feature comprises frequency.

6. A method according to claim 5, wherein the signal feature comprises voltage.

7. A method according to claim 1, wherein the obtaining measures comprises obtaining a plurality of voltage measures at respective different frequencies.

8. A method according to claim 7, wherein the plurality of voltage measures are obtained concurrently at a given one of the times.

9. A method according to claim 1, wherein the strip filter comprises a half wavelength strip resonator coupled filter.

10. An apparatus comprising:
a proximity sensor comprising, in order of stack arrangement: a conductively isolated patch filter, a first substrate, a strip filter, and a ground plane;
a power source configured to provide a driving signal to drive the strip filter;
a measurement circuit configured to obtain measures of a signal feature from the proximity sensor at times, respectively, while an object is sufficiently close to the proximity sensor to affect the measures of the signal feature; and
a distance calculating circuit configured to determine distances of the object relative to the proximity sensor, the distances respectively corresponding to the times, the distances calculated according to the respective measures of the signal feature.

11. An apparatus according to claim 10, wherein the strip filter comprises a half wavelength strip resonator coupled filter.

12. An apparatus according to claim 10, further comprising an array of proximity sensors, wherein the array includes the proximity sensor.

13. An apparatus according to claim 10, wherein the proximity sensor further comprises a conductive patch, and wherein the object and the patch are on opposing sides of the strip filter.

14. An apparatus according to claim 10, wherein a first end of the strip filter comprises a terminal to receive the driving signal and a second end of the strip filter is terminated to reflect the driving signal, the measures of the signal feature obtained from the reflected driving signal.

15. An apparatus according to claim 10, wherein the signal feature comprises frequency, and wherein the distances are determined based on a frequency measure of a peak frequency.

16. An apparatus according to claim 10, wherein the signal feature comprises voltage, and wherein a distance is determined based on a voltage measure determined at a peak of a signal provided by the strip filter.

17. An apparatus comprising:
a proximity sensor comprising, in order of stack arrangement: a conductively isolated patch filter, a first substrate, a strip filter, and a ground plane;
a power source configured to provide a driving signal to drive the strip filter; and
a measurement circuit configured to obtain measures of a signal feature of a signal from the proximity sensor at respective times while an object is sufficiently close to the proximity sensor to affect the measures of the signal feature.

\* \* \* \* \*